United States Patent
Gauthier et al.

(10) Patent No.: US 6,597,218 B1
(45) Date of Patent: Jul. 22, 2003

(54) PROGRAMMABLE BIAS-GENERATOR FOR SELF-BIASING A DELAY LOCKED LOOP

(75) Inventors: Claude Gauthier, Fremont, CA (US); Brian Amick, Austin, TX (US); Dean Liu, Sunnyvale, CA (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/131,308

(22) Filed: Apr. 24, 2002

(51) Int. Cl.$^7$ .................................................. H03L 7/06
(52) U.S. Cl. ........................ 327/158; 327/161; 327/272; 331/DIG. 2; 375/376
(58) Field of Search ......................... 327/146, 147–150, 327/153, 155–159, 161, 162, 270–272, 261, 277, 285; 331/DIG. 2, 1 A; 375/371, 373–376

(56) References Cited

U.S. PATENT DOCUMENTS 6,043,717 A * 3/2000 Kurd ........................... 331/17
6,313,675 B1 * 11/2001 Naffziger ..................... 327/158
6,348,826 B1 * 2/2002 Mooney et al. .............. 327/270
6,411,142 B1 * 6/2002 Abbasi et al. ............... 327/156
6,469,493 B1 * 10/2002 Muething et al. ........ 324/158.1

OTHER PUBLICATIONS

"Low–Jitter Process–Independent DLL and PLL Based on Self–Biased Techniques" Author: John G. Maneatis As published in: "IEEE Journal of Solid–State Circuits" vol. 31, No. 11, Nov., 1996 (10 pages).

* cited by examiner

Primary Examiner—Timothy P. Callahan
Assistant Examiner—Minh Nguyen
(74) Attorney, Agent, or Firm—Rosenthal & Osha L.L.P.

(57) ABSTRACT

A technique Readjusting a bias-generator in a delay locked loop after fabrication of the delay locked loop. The technique involves use of an adjustment circuit operatively connected to the bias-generator, where the adjustment circuit is controllable to facilitate a modification of a voltage output by the bias-generator. Such control of the voltage output by the bias-generator allows a designer to achieve a desired delay locked loop performance characteristic after the delay locked loop has been fabricated.

23 Claims, 5 Drawing Sheets

PROGRAMMABLE BIAS-GENERATOR FOR SELF-BIASING A DELAY LOCKED LOOP

BACKGROUND OF THE INVENTION

To increase processor performance, clock frequencies used by microprocessors, often referred to as "CPUs", have increased. Also, as the number of circuits that can be used in a CPU has increased, the number of parallel operations has risen. Examples of efforts to create more parallel operations include increased pipeline depth and an increase in the number of functional units in super-scalar and very-long-instruction-word architectures. As processor performance continues to increase, the result has been a larger number of circuits switching at faster rates. Thus, from a design perspective, important considerations, such as switching noise and signal integrity must be taken into account.

As the frequencies of modern computers continue to increase, the need to rapidly transmit data between chip interfaces also increases. To accurately receive data, a clock is often sent to help recover the data. The clock determines when the data should be sampled by a receiver's circuits.

The clock may transition at the beginning of the time the data is valid. The receiver would prefer, however, to have a signal during the middle of the time the data is valid. Also, the transmission of the clock may degrade as it travels from its transmission point. In both circumstances, a delay locked loop, or DLL, can regenerate a copy of the clock signal at a fixed phase shift from the original.

FIG. 1 shows a section of a typical computer system component (5). Data (8) that is 'N' bits wide is transmitted from circuit A (6) to circuit B (7). To aid in the recovery of the transmitted data, a clock signal (9) is also transmitted with the data (8). The circuits could also have a path to transmit data from circuit B (7) to circuit A (6) along with an additional clock (not shown). The clock signal (9) may transition from one state to another at the beginning of the data transmission. Circuit B (7) requires a signal temporally located some time after the beginning of the valid data. Furthermore, the clock signal (9) may have degraded during transmission. The DLL has the ability to regenerate the clock signal (9) to a valid state and to create a phase shifted version of the clock to be used by other circuits, for example, a receiver's sampling signal. The receiver's sampling signal determines when the input to the receiver should be sampled. The performance of a DLL is critical, and the DLL must maintain a proper reference of time on the CPU, or generically, an integrated circuit.

One common performance measure for a DLL is jitter. Jitter is the time domain error from poor spectral purity of an output. In other words, the clock signal (9) plus a known phase shift, should track the DLL output. For a signal with a repeated pattern, such as a clock, a transition that occurs from one state to another that does not happen at the same time relative to other transitions is said to have jitter. Jitter represents the perturbations that result in the intermittent shortening or lengthening of signal elements. The DLL input, clock signal (9), may have jitter that may need to be transmitted to the DLL output. The DLL should provide a consistently delayed output.

FIG. 2 shows a block diagram drawing of a representative DLL (200). Clock (201) is input to the representative DLL (200) to create a phased output. Clock (201) is used as an input to a voltage-controlled delay line (210) and to a phase detector (202). The phase detector (202) measures whether the phase difference between clock (201) and an output, clk_out (217), of the delay path is correct. An adjustment in the phase delay produces signals that control a charge pump (204). The phase detector (202) indicates that the charge pump (204) should increase or decrease its output using control signals up, U (203), and down, D (205). The charge pump (204) adds or removes charge from a capacitor $C_1$ (206), that changes a DC value at the input of a bias-generator (208). The capacitor, $C_1$ (206), is connected between a power supply, $V_{DD}$, and a control voltage, $V_{CTRL}$ (207). The bias-generator (208) produces control voltages, $V_{BP}$ (209) and $V_{BN}$ (211), in response to the control voltage, $V_{CTRL}$ (207), that control the delay of the voltage-controlled delay line (210). The voltage-controlled delay line (210) may be implemented using current starved elements. This means that the delays are controlled by modifying the amount of current available for charging and discharging capacitances. The linearity of a voltage controlled delay line's characteristics determines the stable range of frequencies over which the delayed lock loop can operate. Clk_out (217) from the voltage-controlled delay line (210) provides a phase delayed copy of clock (201) to other circuits.

Still referring to FIG. 2, the negative feedback in the loop adjusts the delay through the voltage-controlled delay line by integrating the phase error that results between the periodic reference input, clock (201), and clk_out (217). The voltage-controlled delay line (210) will delay clk out (217) by a fixed amount of time such that a desired delay between clock (201) and clk out (217) exists.

SUMMARY OF THE INVENTION

According to one aspect of the present invention, an integrated circuit including a clock path for carrying a clock signal; a power supply path adapted to receive power from a power supply; a delay locked loop connected to the power supply path including a voltage-controlled delay line for generating a delayed clock signal dependent on an input thereto, a phase detector for detecting a phase difference between the clock signal and the delayed clock signal, and a bias-generator arranged to output a voltage to the input of the voltage-controlled delay line responsive to the phase detector; and an adjustment circuit operatively connected to the input of the voltage-controlled delay line where the adjustment circuit modifies the voltage output by the bias-generator.

According to one aspect of the present invention, a delay locked loop including a voltage-controlled delay line for generating a delayed clock signal dependent on an input thereto, a phase detector for detecting a phase difference between a clock signal and the delayed clock signal, a bias-generator arranged to output a voltage to the input of the voltage-controlled delay line responsive to the phase detector, and an adjustment circuit operatively connected to the input of the voltage-controlled delay line where the adjustment circuit modifies the voltage output by the bias-generator.

According to one aspect of the present invention, a method for modifying an operating characteristic of a delay locked loop including generating a delayed clock signal, comparing the delayed clock signal to a clock signal, adjusting the generating based on the comparing using a bias-generator, generating a binary control word, adjusting an output of the bias-generator in the delay locked loop dependent on the binary control word, and operating the delay locked loop where the adjusting the output of the bias-generator modifies an operating characteristic of the delay locked loop.

Other aspects and advantages of the invention will be apparent from the following description and the appended claims.

DETAILED DESCRIPTION

Embodiments of the present invention relate to an integrated circuit having a delay locked loop, the delay locked loop including a bias-generator and an adjustment circuit operatively connected to an output of the bias-generator to modify an operating characteristic of the delay locked loop. Embodiments of the present invention relate to a method for modifying an operating characteristic of a delay locked loop.

Embodiments of the present invention relate to an adjustment circuit that has a wired-OR connection to an output of a bias-generator. The adjustment circuit may change the voltage produced on the output of the bias-generator. The change in voltage produced on the output of the bias-generator adjusts the output of a voltage-controlled delay line. The adjustment circuit allows modification of the output of the bias-generator, and consequently the output of the voltage-controlled delay line, through a test processor unit.

Delay locked loops are basically first order feedback control systems. As such, the delay locked loop can be described in the frequency domain as having a loop gain and a loop bandwidth. The loop bandwidth is the speed at which a signal completes the feedback loop of the delay locked loop to produce an update (i.e., error signal).

Figure 1:
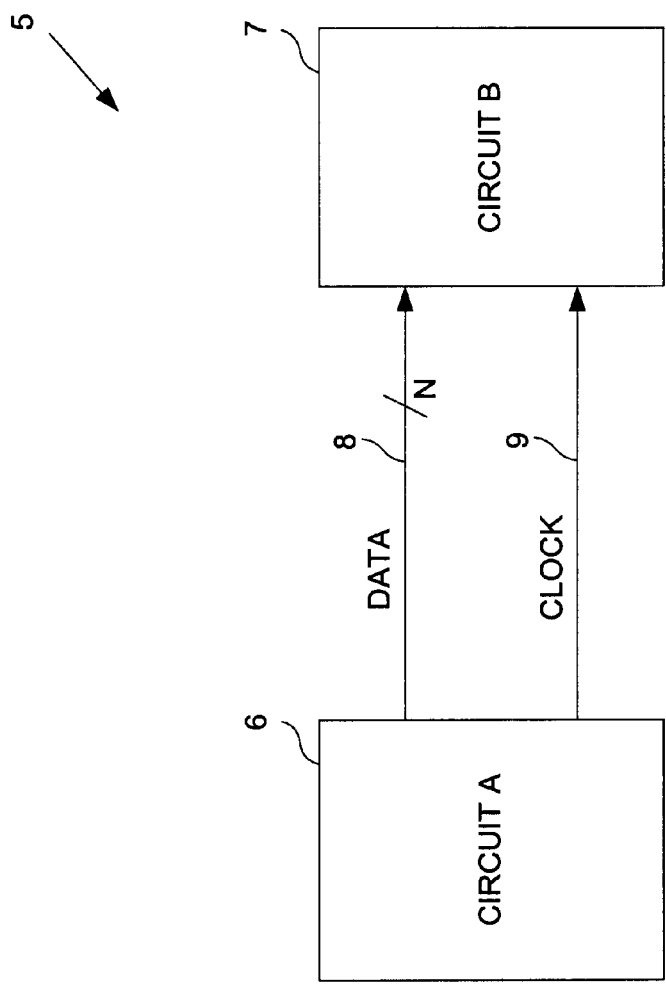
FIG. 1 shows a typical computer system component.
Figure 2:
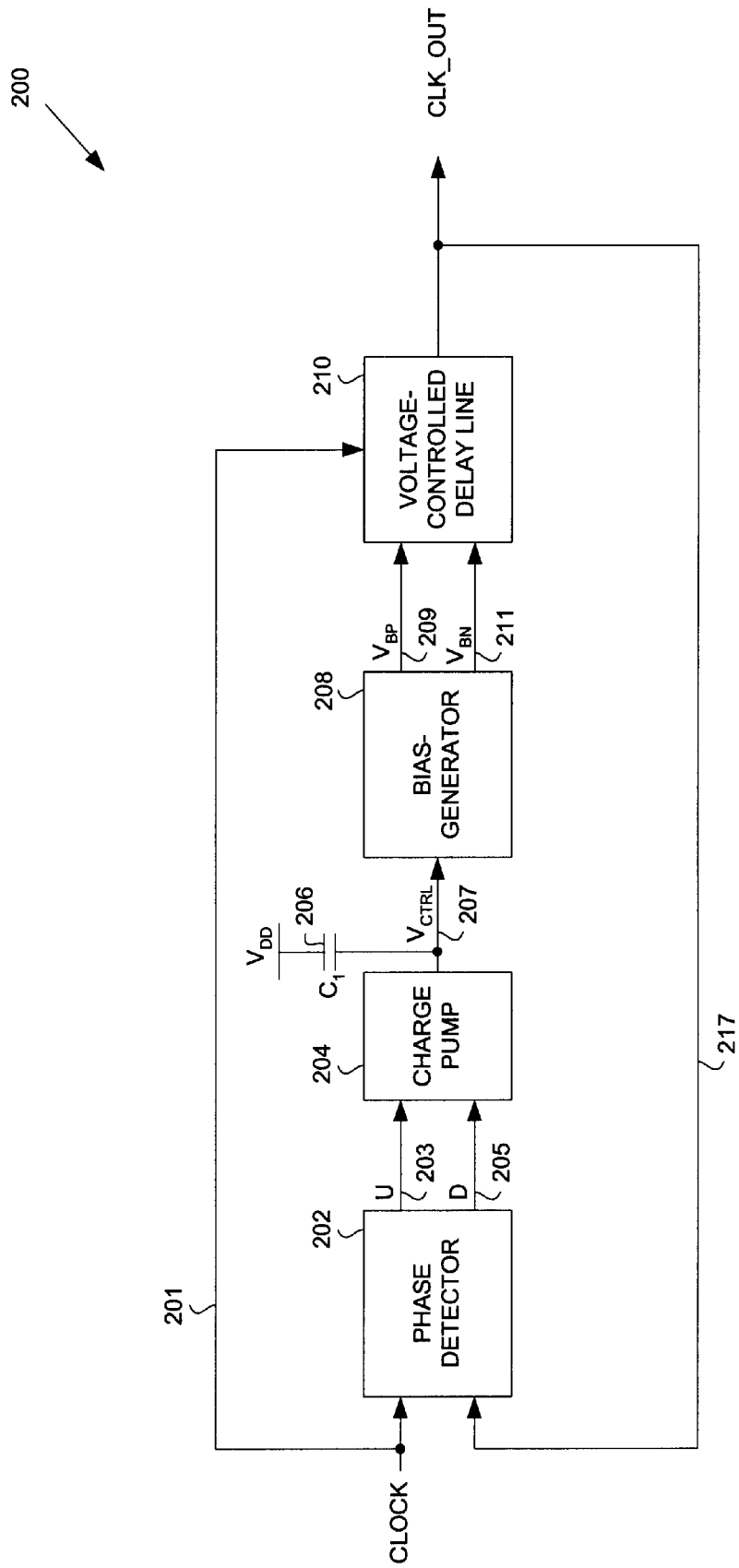
FIG. 2 shows a prior art delay locked loop block diagram.

In FIG. 2, the frequency response of the representative DLL (200) may be analyzed with a Laplace transform approximation, where the sample operation of the phase detector is ignored. This approximation is useful for loop bandwidths about a decade or more below the operating frequency of the DLL. This loop bandwidth constraint is also required for stability due to the reduced phase margin near the higher order poles that result from the delay around the sampled feedback loop. The DLL has a first-order closed loop response.

The response could be formulated in terms of input phase and output phase. This set of variables, however, is incompatible with a continuous time analysis since the sampled nature of the system would need to be considered. A better set of variables is input delay and output delay. The output delay is the delay between clock (201) and the DLL output, clk_out (217), or equivalently, the delay established by the voltage-controlled delay line (210). The input delay is the delay for which the phase detector (202) and charge pump (204) generate no error signal. The output delay, $D_O(s)$, is related to the input delay, $D_I(s)$, by the input-to-output transfer function, $D_O(s)/D_I(s)=1/(1+s/p)$, assuming no delay due to noise. The variable p (in rads/s) is the pole of the loop as determined by the charge pump (204) current, the phase detector (202) gain, the bias-generator (208) gain, $K_{BG}$, the voltage-controlled delay line (210) gain, and the capacitor $C_1$ (206).

The bias-generator gain, $K_{BG}$, is typically equal to one; therefore, $V_{BP}$ (209) is generally equal to $V_{CTRL}$ (207). Any deviation from the ideal bias-generator gain value of one may need to be corrected. If there is an offset in $V_{BP}$ (209) due to variations in fabrication, the delay of the voltage-controlled delay line will not match the simulated performance. In extreme cases, the DLL may not be able generate the expected delay.

For example, if clock (201) is at the highest specified frequency, the control voltage $V_{CTRL}$ (207) may be at a low voltage. If $V_{BP}$ (209) has an offset such that $V_{BP}$ (209) is above the $V_{CTRL}$ (207) voltage, the voltage-controlled delay line (210) delay will never be able to generate a short enough delay to achieve a lock. Conversely, if clock (201) is at the lowest specified frequency, the control voltage $V_{CTRL}$ (207) may be at a high voltage. If $V_{BP}$ (209) has an offset such that $V_{BP}$ (209) is below the $V_{CTRL}$ (207) voltage, the voltage-controlled delay line (210) delay will never be able to generate a long enough delay to achieve a lock.

Those with ordinary skill in the art will appreciate that the ability to adjust the DLL after fabrication is advantageous. Design and simulation of the DLL may show the desired characteristics. After fabrication of the DLL, the characteristics of the manufactured DLL may not be the same as the characteristics of the simulated DLL. The ability to investigate the effects of adjusting the DLL after fabrication is desirable.

Figure 3:
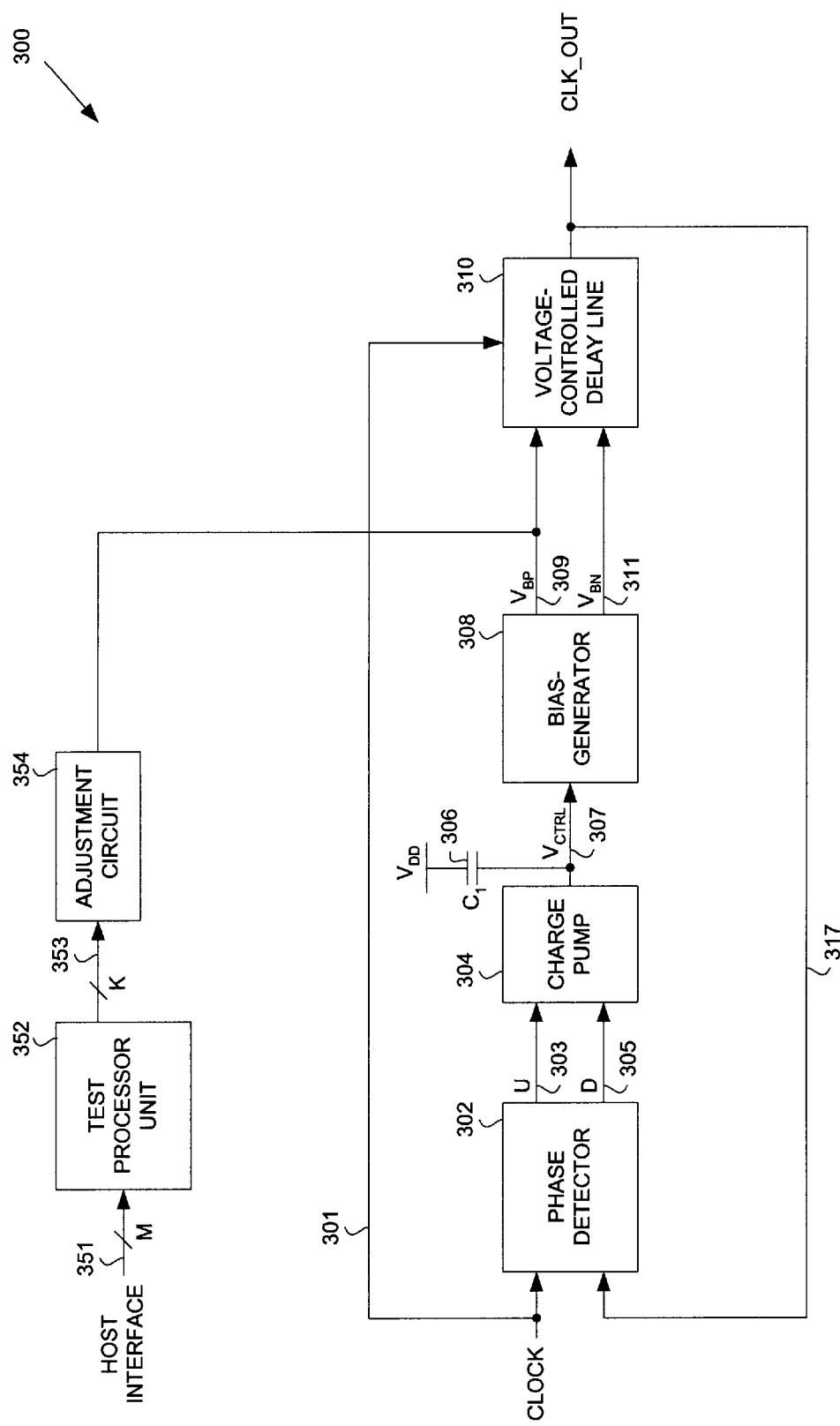
FIG. 3 shows a delay locked loop block diagram in accordance with an embodiment of the present invention.

FIG. 3 shows an adjustable DLL (300) in accordance with an embodiment of the present invention. In FIG. 3, the adjustable DLL (300) may include the representative DLL (200) as in FIG. 2 with the addition of an adjustment circuit (354) controlled by a test processor unit (352). The adjustment circuit (354) may be the same adjustment circuit (500) shown in FIG. 5. The phase detector (302), charge pump (304), capacitor C1 (306), bias-generator (308) and voltage-controlled delay line (310) of the adjustable DLL (300) may operate similarly to the representative DLL (200 in FIG. 2) as previously described.

In FIG. 3, the test processor unit (352) generates a binary control word from registers that determines the settings of the adjustment circuit (354). The test processor unit (352) may change the contents of its registers through a host interface. The host interface may communicate with the test processor unit (352) using M communication lines (351). Those with ordinary skill in the art will appreciate that the host interface and M communication lines (351) may take a wide variety of forms. The host interface may be operatively connected to a separate computer system. The communication may be defined by an industry standard.

The output of the adjustment circuit (354) is connected to the control voltage, $V_{BP}$ (309), using a wired-OR connection The control voltage, $V_{BP}$ (309), is generated as an output from the bias-generator (308). Depending on the binary control word maintained by the registers of the test processor unit (352), multiple control signals K (353) adjust the output of the adjustment circuit (354). An adjustment on control voltage $V_{BP}$ (309) may modify an operating characteristic of the adjustable DLL (300). For example, process or manufacturing variations may create an offset in the control voltage, $V_{BP}$ (309), from a desired nominal operating value. The adjustment circuit (354) may adjust the voltage of the output from the bias-generator (308), or equally the input to the voltage-controlled delay line ((310), to correct the offset.

One with ordinary skill in the art will appreciate that even though the adjustment circuit (354) may be connected to the control voltage, $V_{BP}$ (309), of the bias-generator (308), the adjustment circuit (354) may be turned "off." The adjustment circuit (354) may not have an effect on the adjustable DLL (300).

Those skilled in the art will appreciate that the adjustable DLL (300) may be analog, digital, or a combination of both types of circuits.

Figure 4:
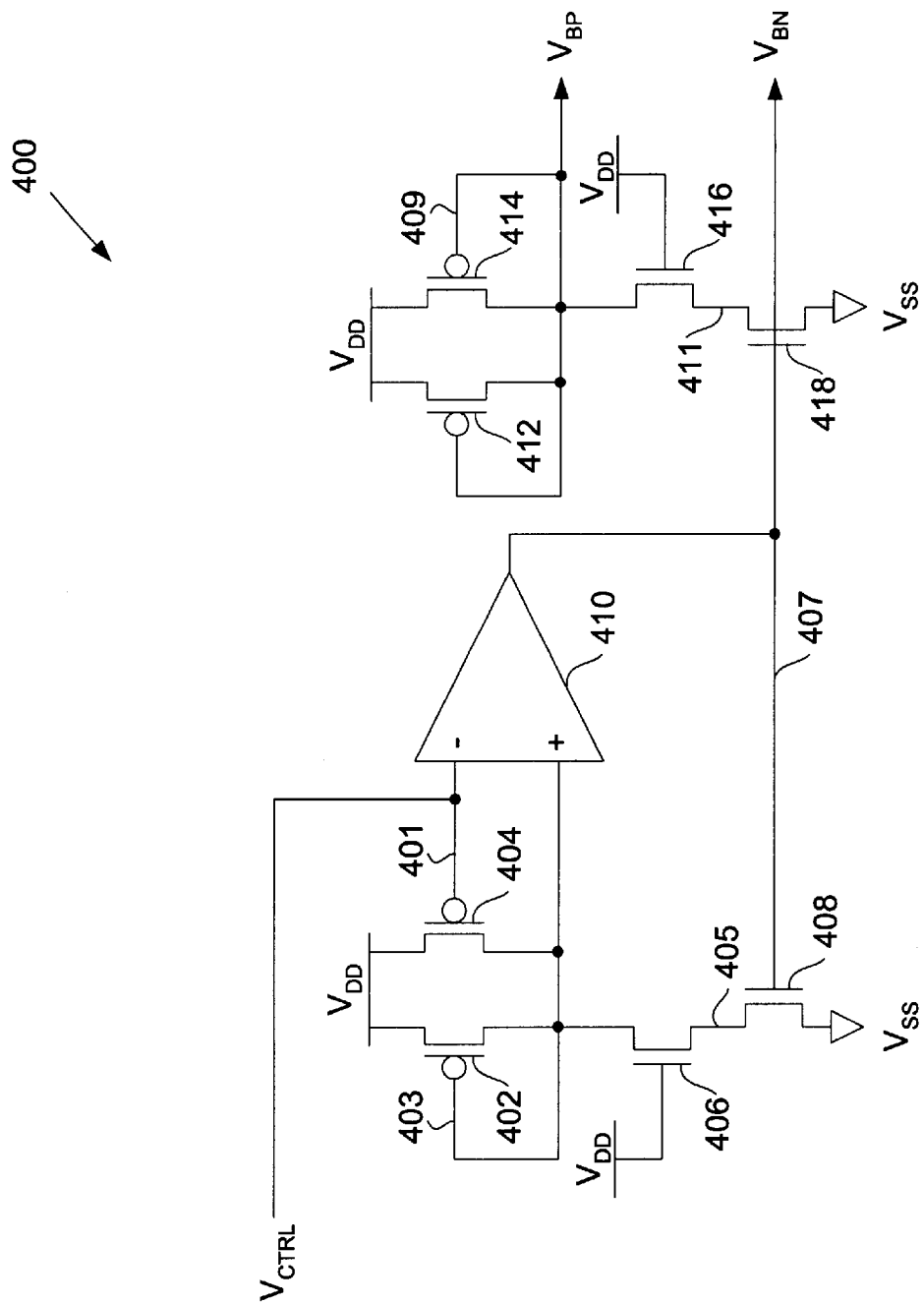
FIG. 4 shows a bias-generator circuit in accordance with an embodiment of the present invention.

FIG. 4 shows a bias-generator circuit (400) in accordance with an embodiment of the present invention. The input voltage, $V_{CTRL}$ (307), in FIG. 3 is the input to the bias-generator circuit (400). The bias-generator (400) produces control voltages, $V_{BP}$ (409) and $V_{BN}$ (407), in response to the input voltage, $V_{CTRL}$ (401). The input voltage, $V_{CTRL}$ (401), is input to a comparator (410) and the gate of a p-channel transistor (404). P-channel transistors (402, 404) form a differential pair where p-channel transistor (402) is diode connected using signal (403). Signal (403) is also connected to the comparator (410). The comparator (410) adjusts its output, control voltage $V_{BN}$ (407), to create a zero voltage difference between input voltage, $V_{CTRL}$ (401), and signal (403).

The control voltage $V_{BN}$ (407) adjusts the current flow through n-channel transistors (408, 418). N-channel transistors (406, 416) provides resistive elements, as their gates are connected to $V_{DD}$. P-channel transistors (412, 414) form another differential pair where p-channel transistors (412, 414) are both diode connected using control voltage, $V_{BP}$ (409). The control voltage, $V_{BP}$ (409), may have a nominal voltage similar in value to the input voltage, $V_{CTRL}$ (401). Due to process variations during manufacture or simulation modeling different from the physical transistors, the control voltage, $V_{BP}$ (409), may not have a similar voltage value, i.e., offset, to the input voltage, $V_{CTRL}$ (401). The adjustment circuit (500) in FIG. 5 provides a means to correct the offset.

Those skilled in the art will appreciate that the bias-generator circuit (400) shows a circuit arrangement in which the control voltage, $V_{BP}$ (409), may have a nominal voltage similar in value to the input voltage, $V_{CTRL}$ (401). A bias-generator may also be designed such that the control voltage, $V_{BN}$ (407), may have a nominal voltage similar in value to the input voltage, $V_{CTRL}$ (401). In this arrangement, the control voltage, $V_{BP}$ (409), may be representative of a voltage necessary to create a zero voltage difference between two inputs to a comparator. In this arrangement, the adjustment circuit (354) in FIG. 3 may have its output connected to the control voltage, $V_{BN}$ (407), in FIG. 4, instead of the control voltage, $V_{BP}$ (409). The ability to adjust the adjustable DLL (300) in FIG. 3 with this arrangement is expected to be similar to the ability to adjust the adjustable DLL (300) in FIG. 3 using the bias-generator circuit (400) shown in FIG. 4.

Figure 5:
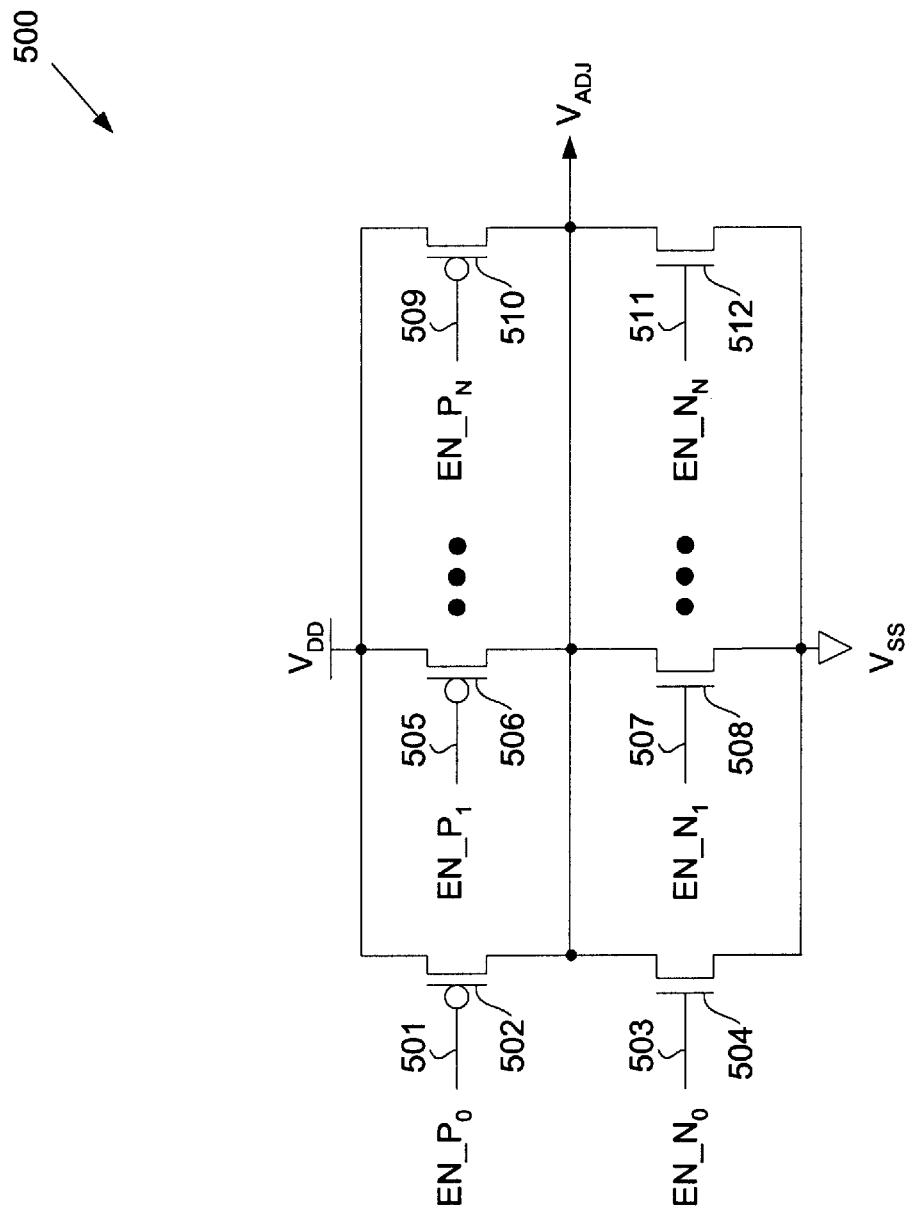
FIG. 5 shows an adjustment circuit in accordance with an embodiment of the present invention.

In FIG. 5, an adjustment circuit (500) in accordance with an embodiment of the present invention is shown. The adjustment circuit may include multiple p-channel transistors (502, 506, 510) arranged in parallel with each other. The multiple p-channel transistors (502, 506, 510) connect between the power supply $V_{DD}$ and a common node, $V_{ADJ}$. The adjustment circuit also includes multiple n-channel transistors (504, 508, 512) arranged in parallel with each other. The multiple n-channel transistors (504, 508, 512) connect between ground, $V_{SS}$, and a common node, $V_{ADJ}$.

Each transistor may have an individual control signal to turn "on" or "off" one or more of the p-channel transistors (502, 506, 510) or n-channel transistors (504, 508, 512). The p-channel transistors (502, 506, 510) have control signals EN_$P_0$ (501), EN_$P_1$ (505), and EN_$P_N$ (509) connected to their gates, respectively. The n-channel transistors (504, 508, 512) have control signals EN_$N_0$ (503), EN_$N_1$ (507), and EN_$N_N$ (511) connected to their gates, respectively. A low voltage on any of the EN_$P_X$ signals (501, 505, 509) will turn "on" their respective p-channel transistors (502, 506, 510). A high voltage on any of the EN_$N_X$ signals (503, 507, 511) will turn "on" their respective n-channel transistors (504, 508, 512).

Any p-channel transistor (502, 506, 510) that is "on" will have a tendency to increase the voltage on $V_{ADJ}$ toward $V_{DD}$. Any n-channel transistor (504, 508, 512) that is "on" will have a tendency to decrease the voltage on $V_{ADJ}$ toward $V_{SS}$. By selecting which p-channel transistors (502, 506, 510) and/or n-channel transistors (504, 508, 512) are 'on', a change in the voltage on $V_{ADJ}$ may be achieved.

Those with ordinary skill in the art will appreciate that the p-channel transistors (502, 506, 510) and n-channel transistors (504, 508, 512) may be turned "on" individually or as a group. The p-channel transistors (502, 506, 510) and n-channel transistors (504, 508, 512) may be sized so that each transistor has a different effect compared to the other transistors, specifically the transistor's gate width may be varied to adjust the strength of each transistor. The gate widths may be designed to provide a linear, exponential, or other function as more transistors are turn "on."

The p-channel transistors (502, 506, 510) and n-channel transistors (504, 508, 512) may be sized so that each transistor has an inherently resistive nature, specifically the transistor gate lengths may be increased (i.e., long channel transistors) to increase the inherent resistance of each transistor. A larger inherent resistance may be advantageous if both a p-channel transistor and a n-channel transistor are "on" simultaneously. The adjustment circuit (500) may include only one p-channel transistor, e.g., p-channel transistor (502), and one n-channel transistor, e.g., n-channel transistor (504), connected in series.

The multiple control signals K (353) in FIG. 3 may represent EN_$N_X$ signals (503, 507, 511) in FIG. 5 and EN_$P_X$ signals (501, 505, 509) in FIG. 5. The multiple control signals K (353) in FIG. 3 may turn "on" or "off" the p-channel transistors (502, 506, 510) in FIG. 5 and n-channel transistors (504, 508, 512) in FIG. 5 in the adjustment circuit (354) in FIG. 3. The common node, $V_{ADJ}$ (FIG. 5), of the adjustment circuit (354) in FIG. 3 may adjust the voltage on control voltage, $V_{BP}$ (309), in FIG. 3.

Advantages of the present invention may include one or more of the following. In some embodiments, because an adjustment circuit may modify the operating characteristics of the adjustable DLL (300), an investigation of the adjustable DLL (300) response during operating conditions may be performed. The adjustable DLL (300), having been manufactured, demonstrates characteristics that may not have been apparent from simulation. Realistic results help determine appropriate values for circuit elements within the adjustable DLL (300) and help alleviate costly over design.

In some embodiments, because the adjustable DLL (300) may be manufactured with a means for adjusting the output of the bias-generator, fewer design iterations and higher confidence in the adjustable DLL (300) operating characteristics may be afforded. Likewise, the adjustable DLL (300) may help determine the proper values and sizes for the circuits in the bias-generator (400) in FIG. 4 and/or charge pump (304) in FIG. 3. The adjustment circuit (500) may help resolve any offset between the input voltage, $V_{CTRL}$ (307) in FIG. 3, and the control voltage, $V_{BP}$ (309) in FIG. 3.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a clock path for carrying a clock signal;
   a power supply path adapted to receive power from a power supply;
   a delay locked loop connected to the power supply path, comprising:
      a voltage-controlled delay line for generating a delayed clock signal dependent on an input thereto;
      a phase detector for detecting a phase difference between the clock signal and the delayed clock signal; and
      a bias-generator arranged to output a voltage to the input of the voltage-controlled delay line responsive to the phase detector; and
   an adjustment circuit operatively connected to the input of the voltage-controlled delay line, wherein the adjustment circuit modifies the voltage output by the bias-generator, wherein the adjustment circuit comprises a first p-channel transistor and a first n-channel transistor, and wherein the first p-channel transistor and the first n-channel transistor are connected in series.

2. The delay locked loop of claim 1, wherein the adjustment circuit comprises a first switch to provide current flow between a first voltage provided by the power supply path and the input of the voltage-controlled delay line, and a second switch to provide current flow between a second voltage provided by the power supply path and the input of the voltage-controlled delay line.

3. The integrated circuit of claim 1, the adjustment circuit further comprising:
   a second p-channel transistor connected in parallel with the first p-channel transistor; and
   a second n-channel transistor connected in parallel with the first n-channel transistor, wherein the first p-channel transistor and second p-channel transistor are in series with the first n-channel transistor and second n-channel transistor.

4. The integrated circuit of claim 3, wherein the first p-channel transistor is a longer channel transistor than the second p-channel transistor.

5. The integrated circuit of claim 3, wherein the first n-channel transistor is a longer channel transistor than the second n-channel transistor.

6. The integrated circuit of claim 3, wherein the first p-channel transistor is a wider gate width transistor than the second p-channel transistor.

7. The integrated circuit of claim 3, wherein the first n-channel transistor is a wider gate width transistor than the second n-channel transistor.

8. The integrated circuit of claim 1, wherein the adjustment circuit is connected to the output of the bias-generator with a wired-OR connection.

9. The integrated circuit claim 1, further comprising:
   a test processor unit, wherein the test processor unit generates a binary control word.

10. The integrated circuit of claim 9, wherein the adjustment circuit is responsive to the binary control word.

11. A delay locked loop comprising:
   a voltage-controlled delay line for generating a delayed clock signal dependent on an input thereto;
   a phase detector for detecting a phase difference between a clock signal and the delayed clock signal;
   a bias-generator arranged to output a voltage to the input of the voltage-controlled delay line responsive to the phase detector; and
   an adjustment circuit operatively connected to the input of the voltage-controlled delay line, wherein the adjustment circuit modifies the voltage output by the bias-generator, wherein the adjustment circuit comprises a first p-channel transistor and a first n-channel transistor, and wherein the first p-channel transistor and the first n-channel transistor are connected in series.

12. The integrated circuit of claim 11, wherein the adjustment circuit comprises a first switch to provide current flow between a first voltage and the input of the voltage-controlled delay line, and a second switch to provide current flow between a second voltage and the input of the voltage-controlled delay line.

13. A method for modifying an operating characteristic of a delay locked loop, comprising:
   generating a delayed clock signal;
   comparing the delayed clock signal to a clock signal;
   adjusting the generating based on the comparing using a bias-generator;
   generating a binary control word;
   adjusting an output of the bias-generator in the delay locked loop dependent on the binary control word, wherein the adjusting the output of the bias-generator is performed by an adjustment circuit, wherein the adjustment circuit comprises a first p-channel transistor and a first n-channel transistor, and wherein the first p-channel transistor and the first n-channel transistor are connected in series; and
   operating the delay locked loop, wherein the adjusting the output of the bias-generator modifies an operating characteristic of the delay locked loop.

14. The method of claim 13, wherein the adjusting the output of the bias-generator comprises controlling a first current flow between a first voltage and the output of the bias-generator, and controlling a second current flow between a second voltage and the output of the bias-generator.

15. The method of claim 13, wherein the adjusting the output of the bias-generator is performed by an adjustment circuit, wherein the adjustment circuit comprises a first switch to provide current flow between a first voltage and the output of the bias-generator, and a second switch to provide current flow between a second voltage and the output of the bias-generator.

16. The method of claim 13, the adjustment circuit further comprising:
   a second p-channel transistor connected in parallel with the first p-channel transistor; and
   a second n-channel transistor connected in parallel with the first n-channel transistor, wherein the first p-channel transistor and second p-channel transistor are in series with the first n-channel transistor and second n-channel transistor.

17. The method of claim 16, wherein the first p-channel transistor is a longer channel transistor than the second p-channel transistor.

18. The method of claim 16, wherein the first n-channel transistor is a longer channel transistor than the second n-channel transistor.

19. The method of claim 16, wherein the first p-channel transistor is a wider gate width transistor than the second p-channel transistor.

20. The method of claim 16, wherein the first n-channel transistor is a wider gate width transistor than the second n-channel transistor.

21. The method of claim 13, wherein the adjusting the output of the bias-generator is performed by an adjustment circuit connected to the output of the bias-generator with a wired-OR connection.

22. The method of claim 13, wherein generating the binary control word is performed by a test processor unit.

23. An integrated circuit having a delay locked loop, the delay locked loop comprising:

means for delaying a clock signal to generate a delayed clock signal;

means for comparing the delayed clock signal to a clock signal;

means for adjusting the delaying based on the comparing using a bias-generator;

means for generating a binary control word;

adjusting means for adjusting an output of the bias-generator in the delay locked loop dependent on the binary control word, wherein the adjusting means comprises a p-channel transistor and an n-channel transistor, and wherein the p-channel transistor and the n-channel transistor are connected in series; and means for operating the delay locked loop, wherein the adjusting means modifies an operating characteristic of the delay locked loop.

\* \* \* \* \*

UNITED STATES PATENT AND TRADEMARK OFFICE
CERTIFICATE OF CORRECTION

PATENT NO. : 6,597,218 B1
DATED : July 22, 2003
INVENTOR(S) : Claude Gauthier et al.

It is certified that error appears in the above-identified patent and that said Letters Patent is hereby corrected as shown below:

<u>Title page,</u>
Item [57], ABSTRACT,
Line 1, replace "Readjusting" with -- adjusts --.

Signed and Sealed this

Fourth Day of November, 2003

JAMES E. ROGAN
*Director of the United States Patent and Trademark Office*